Figure 1:
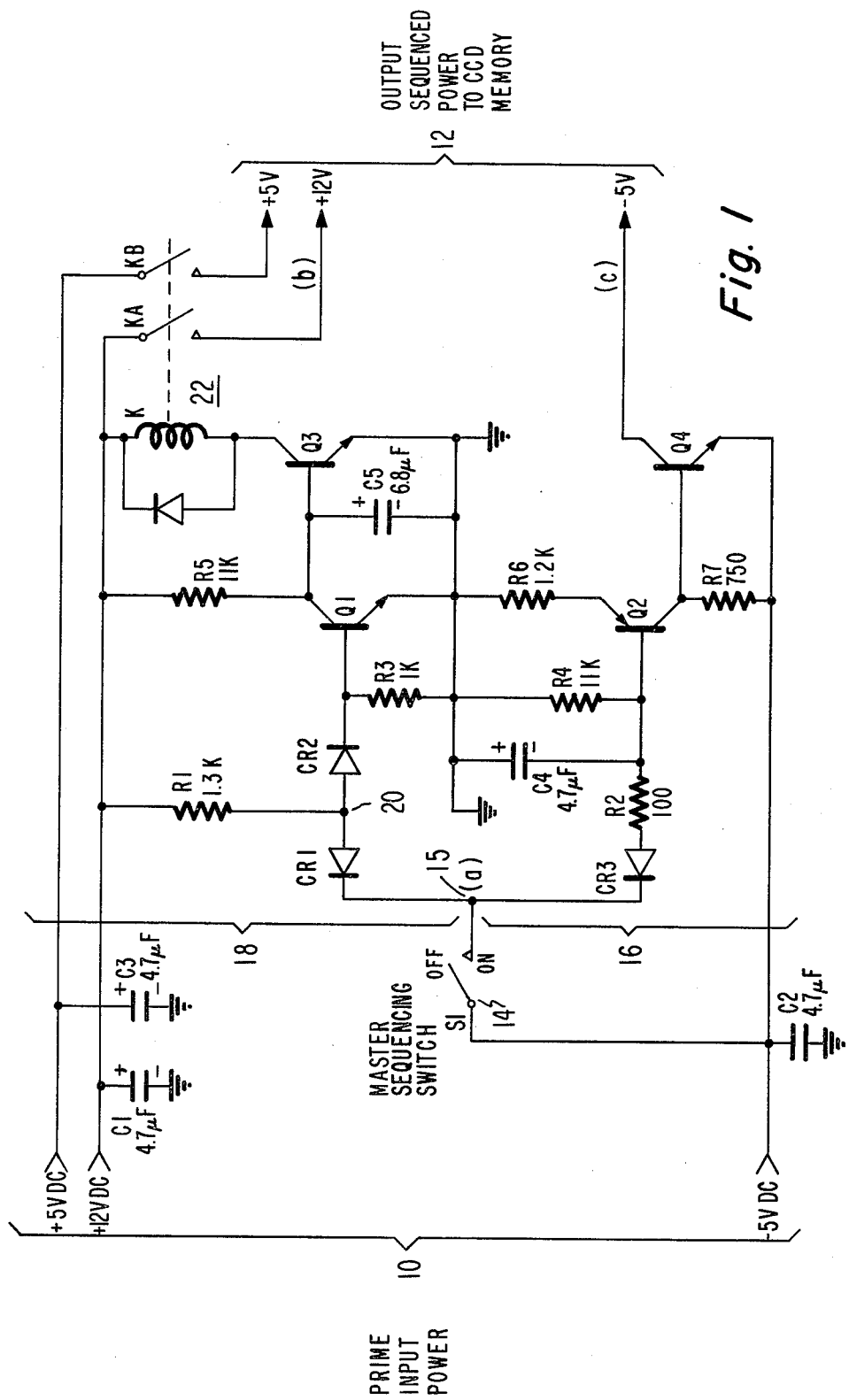

United States Patent [19]

Dion

[11] 4,323,789
[45] Apr. 6, 1982

[54] SEQUENCER FOR POWER SUPPLY VOLTAGES

[75] Inventor: Donald F. Dion, Burlington, Mass.

[73] Assignee: RCA Corporation, New York, N.Y.

[21] Appl. No.: 135,934

[22] Filed: Mar. 31, 1980

[51] Int. Cl.³ .......................................... H03K 17/60
[52] U.S. Cl. ...................................... 307/81; 307/29;
307/596; 361/196
[58] Field of Search ....................... 307/81, 28, 29, 75,
307/130, 595, 596, 597, 598; 328/75, 130;
361/195, 196

[56] References Cited

U.S. PATENT DOCUMENTS 3,546,489 12/1976 White .................................. 307/597
4,151,425 8/1979 Cappa .................................. 307/130

Primary Examiner—Michael L. Gellner
Assistant Examiner—James L. Dwyer
Attorney, Agent, or Firm—Samuel Cohen; Robert L. Troike; Raymond E. Smiley

[57] ABSTRACT

A sequencer for two power supply voltages includes a master on-off switch, and two transistor switches which operate in response to the closing and then the opening of the master switch to turn on one voltage before the other is turned on, and to turn the one voltage off after the other is turned off. The sequencer is useful, for example, in connection with charge-coupled device apparatus.

7 Claims, 2 Drawing Figures

SEQUENCER FOR POWER SUPPLY VOLTAGES

This invention relates to initializer or sequencer circuits for switching power supply voltages on and off in a predetermined sequence which may be required by the apparatus to which the power supply voltages are applied. An example of an electronic apparatus requiring a sequential application of, and removal of, power supply voltages is a memory made of a certain type of charge-coupled device integrated circuit memory units.

An example of a sequencer according to the invention includes a master on-off switch, a first transistor switch circuit operative to switch on a first voltage quickly when the master switch is closed, and to switch off the voltage at a delayed time following the opening of the master switch. A second transistor switch circuit is operative to switch on a second voltage at a delayed time following the closing of the master switch, and to switch off the voltage quickly when the master switch is opened.

Figure 2:
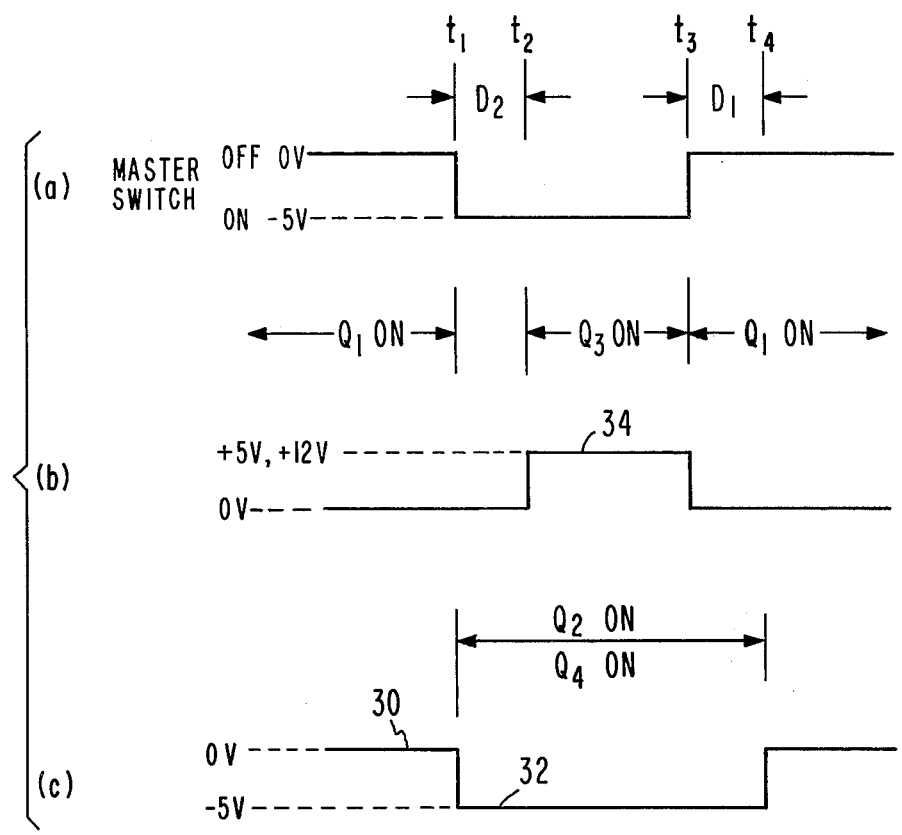

In the drawing:

FIG. 1 is a circuit diagram of a sequencer constructed according to the teachings of the invention; and FIG. 2 is a chart of voltage waveforms which will be referred to in describing the operation of the invention.

Referring now in greater detail to the specific example of the invention shown in FIG. 1, a sequencer is shown between input power supply voltage terminals labeled $-5$ v. DC, $+12$ v. DC and $+5$ v. DC at 10, referenced to ground through filter capacitors $C_2$, $C_1$ and $C_3$, and corresponding output power supply voltage terminals at 12. The sequencer includes a master on-off switch 14, which may be a manually-operated switch, having one terminal connected to the $-5$ v. power supply voltage terminal, and having its other terminal connected through a junction point 15 to a first transistor switch circuit 16 and to a second transistor switch circuit 18.

The first transistor switch circuit 16 includes a PNP transistor $Q_2$ having a base connected through resistor $R_2$ and diode $CR_3$ to the output terminal of the master switch 14, a base-emitter circuit including resistors $R_4$ and $R_6$ and a capacitor $C_4$, and a collector resistor $R_7$. The collector of transistor $Q_2$ is connected to the base of NPN transistor $Q_4$ which has its collector connected to the $-5$ v. output terminal.

The second transistor switch circuit 18 includes an NPN transistor $Q_1$ having a base connected through resistor $R_3$ to ground, and through diode $CR_2$ to a junction point 20 which is connected through a resistor $R_1$ to the $+12$ v. DC input terminal, and through a diode $CR_1$ to the output terminal of the master switch 14. The collector of transistor $Q_1$ is connected through a collector resistor $R_5$ to the $+12$ v. DC terminal, and to the base of an NPN transistor $Q_3$ having a base-emitter capacitor $C_5$. The collector of transistor $Q_3$ is connected through a coil K of a relay 22 to the $+12$ v. DC terminal. The relay has sets of switch contacts KA and KB in the lines connecting the $+5$ v. and $+12$ v. inputs 10 to the corresponding outputs 12.

The operation of the sequencer of FIG. 1 will now be described with references to the voltage waveforms of FIG. 2. When master on-off switch 14 is in the "off" position shown, none of the power supply voltages at input 10 are supplied to the output 12. The transistor $Q_2$ is non-conducting or off because base resistor $R_4$ connected to ground keeps the base at the same potential as the emitter. Transistor $Q_4$ is also kept off by a lack of base-emitter voltage from across the collector resistor $R_7$ of transistor $Q_2$. The output voltage at the collector of transistor $Q_4$ (C) is zero volts as shown at 30 of waveform (C) of FIG. 2.

When, at time $t_1$ in FIG. 2, the master switch 14 is closed, it connects $-5$ v. DC from input 10 through junction point 15, diode $CR_3$ and resistor $R_2$ to the base of non-conducting transistor $Q_2$ in the first transistor switch circuit 16. The negative voltage on the base of transistor $Q_2$ causes it to turn on, and the resulting voltage drop across collector resistor $R_7$ causes transistor $Q_4$ to turn on. When transistor $Q_4$ is on, the $-5$ v. at the input 10 is then coupled through the emitter-collector path of transistor $Q_4$ to the $-5$ v. output terminal at 12.

During this condition which is illustrated at 32 on waveform 2 (C), the terminal of capacitor $C_4$ connected to the base of transistor $Q_2$ becomes negatively charged. Then, at time $t_3$ when master switch 14 is opened, the charge keeps transistors $Q_2$ and $Q_4$ on for a time period, $D_1$ in FIG. 2, until the capacitor $C_4$ discharges through resistor $R_4$. In the described operation of the first transistor switch circuit, the closing of master switch 14 at time $t_1$ causes a quick turn on of the $-5$ v. supply, and the opening of the master switch at time $t_3$ causes a turn-off of the $-5$ v. supply at a time $t_4$ after a time delay $D_1$.

The operation of the second transistor switch circuit 18 will now be described. During the initial condition when the master switch 14 is off, transistor $Q_1$ is conductive because of the voltage supplied from the $+12$ v. supply through resistor $R_1$ and diode $CR_2$ to the base of the transistor, and transistor $Q_3$ is non-conductive because of the voltage drop across the collector resistor $R_5$ of transistor $Q_1$, that is, because the voltage at the base of transistor $Q_3$ is lower than the emitter-base threshold voltage $V_T$ of transistor $Q_3$.

When master switch 14 is closed at time $t_1$, transistor $Q_1$ is rendered non-conductive because the current previously supplied through resistor $R_1$ to its base is diverted through diode $CR_1$ to the negative current sink at point 15. But, with transistor $Q_1$ off, transistor $Q_3$ does not turn on until after a time period $D_2$ during which the capacitor $C_5$ is charged up to a value which exceeds the threshold voltage $V_T$ of $Q_3$, by current through resistor $R_5$ from the $+12$ v. power supply. Therefore, it is not until time $t_2$ that the collector current of transistor $Q_3$ operates the relay 22 which connects the $+5$ v. DC and the $+12$ v. DC power supplies at input 10 to the corresponding terminals at output 12. This condition is represented at 34 on the waveform (b) of FIG. 2.

At time $t_3$ when the master switch 14 is opened, transistor $Q_1$ is quickly rendered conductive, so that it quickly discharges the capacitor $C_5$, which quickly turns transistor $Q_3$ off. When transistor $Q_3$ turns off, contacts $K_A$ and $K_B$ of relay 22 open and disconnect the $+5$ v. and $+12$ v. output voltages at 12. The relay 22 has an operating time of only about 2 milliseconds.

In summary, the operation of the sequencer of FIG. 1 is as illustrated in FIG. 2 where the turning on of the master switch 14 at time $t_1$ causes a quick turning on of the $-5$ v. supply, followed by a delayed turning on of the $+5$ v. and $+12$ v. supplies. And, the turning off of the master switch 14 at time $t_3$ causes a quick turn off of the $+5$ v. and $+12$ v. supplies, followed by a delayed turning off of the $-5$ v. supply. The $-5$ v. supply is turned on before, and remains on longer than, the other two supplies.

What is claimed is:

1. A sequencer for switching two power supply voltages on and off, comprising
    a master on-off switch,
    a first transistor switch circuit operated by said master switch and operative to switch one of said power supply voltages on and off, said first transistor switch circuit including a first capacitor to cause the circuit to respond after a time delay to the opening of said master switch, and
    a second transistor switch circuit operated by said master switch and operative to switch the second one of said power supply voltages on and off, said second transistor switch circuit including a second capacitor to cause the circuit to respond after a time delay to the closing of said master switch.

2. A sequencer as defined in claim 1 wherein said master on-off switch is a manually-operated switch.

3. A sequencer as defined in claim 2 wherein said first transistor switch circuit includes an input transistor having said first capacitor connected in the base-emitter circuit of the transistor.

4. A sequencer as defined in claim 3 wherein said first transistor switch circuit includes an output transistor controlled by said input transistor.

5. A sequencer as defined in claim 4 wherein said second transistor switch circuit includes an input transistor coupled to an output transistor having said second capacitor connected in the base-emitter circuit of said second transistor switch output transistor.

6. A sequencer as defined in claim 5 wherein a relay is operated by the output transistor in said second transistor switch, and said second relay switches the power supply voltage on and off.

7. A sequencer as defined in claim 6 wherein said sequencer is powered by said two power supply voltages.

* * * * *